US011315883B2

(12) United States Patent
Hu et al.

(10) Patent No.: US 11,315,883 B2
(45) Date of Patent: Apr. 26, 2022

(54) INTEGRATED CIRCUIT PRODUCT CUSTOMIZATIONS FOR IDENTIFICATION CODE VISIBILITY

(71) Applicants: Advanced Micro Devices, Inc., Santa Clara, CA (US); ATI Technologies ULC, Markham (CA)

(72) Inventors: Suming Hu, Richmond Hill (CA); Roden Topacio, Springwater (CA); Farshad Ghahghahi, San Jose, CA (US); Jianguo Li, Scarborough (CA); Andrew Kwan Wai Leung, Markham (CA)

(73) Assignees: Advanced Micro Devices, Inc., Santa Clara, CA (US); ATI Technologies ULC, Markham (CA)

( * ) Notice: Subject to any disclaimer, the term of this patent is extended or adjusted under 35 U.S.C. 154(b) by 26 days.

(21) Appl. No.: 16/680,978

(22) Filed: Nov. 12, 2019

(65) Prior Publication Data
US 2021/0143104 A1    May 13, 2021

(51) Int. Cl.
*H01L 23/544* (2006.01)
*H01L 23/18* (2006.01)
*H01L 23/12* (2006.01)

(52) U.S. Cl.
CPC ............ *H01L 23/544* (2013.01); *H01L 23/12* (2013.01); *H01L 23/18* (2013.01); *H01L 2223/54413* (2013.01); *H01L 2223/54433* (2013.01)

(58) Field of Classification Search
CPC .................................................. H01L 23/544
USPC ........................................................ 257/734
See application file for complete search history.

(56) References Cited

U.S. PATENT DOCUMENTS

| 6,710,444 B2 | 3/2004 | Xie et al. |
| 6,806,563 B2 | 10/2004 | Libous et al. |
| 6,821,823 B2 | 11/2004 | Xie et al. |
| 6,906,414 B2 | 6/2005 | Zhao et al. |

(Continued)

FOREIGN PATENT DOCUMENTS

JP    05267482 A  * 10/1993  ......... H01L 27/1266

OTHER PUBLICATIONS

Liu, X., et al., "Design and Assembly of a Double-Sided 3D Package with a Controller and a DRAM Stack," Conference Paper in Proceedings of Electronic Components and Technology Conference, May 2012, 9 pages.

(Continued)

*Primary Examiner* — Ajay Arora
(74) *Attorney, Agent, or Firm* — Zagorin Cave LLP (57) ABSTRACT

An apparatus includes a substrate including an identification code on a first side of the substrate and near a perimeter of the substrate. The apparatus includes a stiffener structure attached to the first side of the substrate. The stiffener structure has a cutout in an outer perimeter of the stiffener structure. The stiffener structure is oriented with respect to the substrate to cause the cutout to expose the identification code. The cutout may have a first dimension and a second dimension orthogonal to the first dimension. The first dimension may exceed a corresponding first dimension of the identification code and the second dimension may exceed a corresponding second dimension of the identification code, thereby forming a void region between the identification code and edges of the stiffener structure.

21 Claims, 8 Drawing Sheets

(56) References Cited

U.S. PATENT DOCUMENTS

| | | | |
|---|---|---|---|
| 7,007,855 B1* | 3/2006 | Barker | H01L 23/544 |
| | | | 235/494 |
| 7,202,559 B2 | 4/2007 | Zhao et al. | |
| 7,207,822 B2 | 4/2007 | Szu | |
| 7,432,586 B2 | 10/2008 | Zhao et al. | |
| 7,791,189 B2 | 9/2010 | Zhao et al. | |
| 9,867,282 B2 | 1/2018 | Hu et al. | |
| 2002/0141755 A1* | 10/2002 | Manabe | G03B 17/02 |
| | | | 396/536 |
| 2005/0280139 A1 | 12/2005 | Zhao et al. | |
| 2008/0057625 A1* | 3/2008 | Chan | H01L 23/16 |
| | | | 438/113 |
| 2014/0128815 A1 | 5/2014 | Cabiri et al. | |
| 2020/0105679 A1* | 4/2020 | Bae | H01L 23/544 |

OTHER PUBLICATIONS

Wikipedia, "QR code," downloaded from https://en.wikipedia.org/w/index.php?title=QR_code&oldid=925055233 on Nov. 12, 2019, 24 pages.

* cited by examiner

INTEGRATED CIRCUIT PRODUCT CUSTOMIZATIONS FOR IDENTIFICATION CODE VISIBILITY

BACKGROUND

Description of the Related Art

A typical integrated circuit product includes a substrate supporting multiple integrated circuit die and discrete devices, which are not manufacturable by integrated circuit manufacturing techniques. A conventional substrate includes multiple layers and includes electrical interconnects and bond pads for connection to the integrated circuit die and discrete devices. The conventional substrate also provides electrical conductors between pins, pads, solder balls or other terminals of the substrate for coupling the integrated circuit product to a printed circuit board or other electrical device. The integrated circuit die are attached to the substrate, e.g., by placing the components on the substrate, enabling metallurgical bonding of electrical contacts of the integrated circuit die to electrical contacts of the substrate, and applying underfill material and adhesive to protect electrical contacts and secure the die components to the substrate. The discrete devices may be surface mount technology (SMT) devices that are attached to solder pads on the substrate by solder reflow techniques. Those discrete devices are typically attached to the substrate in regions surrounding integrated circuit die (e.g., regions surrounding 2D, 2.5D or 3D integrated circuit modules).

Substrate warpage occurs due to a mismatch of coefficients of thermal expansion of the electrical components, underfill, and substrate. Substrate warpage can compromise electrical contacts and render the integrated circuit product faulty or inoperable. Accordingly, a stiffener structure (i.e., a stiffening structure, e.g., a stiffener ring or a stiffener frame) is attached to a side of the substrate to provide stiffness that reduces or eliminates substrate warpage. Typical stiffener structures are formed from opaque materials e.g., copper, aluminum, steel, or ceramic materials, include an aperture for dissipation of heat from integrated circuit devices and are attached to the substrate using an adhesive. Exemplary stiffener structures are formed by stamping the structure from a metal sheet using a stamping tool, although other manufacturing techniques may be used.

Assembly of a typical integrated circuit product involves various steps. An identification code on the package substrate provides traceability of the integrated circuit product and should be visible during and after the assembly process. Traceability of the integrated circuit product increases safety and reliability. If the integrated circuit product fails, the manufacturer can quickly and easily use the identification code to identify when and where the integrated circuit product was produced and access information regarding subcomponents of the integrated circuit product. This information may be used in recalls, warranty decisions, or failure analysis during or after manufacture. However, the identification code occupies space on the substrate, may interact with other elements of the packaged integrated circuit product, and may influence the floorplan design of the integrated circuit product. Accordingly, non-intrusive techniques for incorporating an identification code in an integrated circuit product are desired.

SUMMARY OF EMBODIMENTS OF THE INVENTION

In at least one embodiment, an integrated circuit product includes a substrate including an identification code on a first side of the substrate and near a perimeter of the substrate. The integrated circuit product includes a stiffener structure attached to the first side of the substrate. The stiffener structure has a cutout in an outer perimeter of the stiffener structure. The stiffener structure is oriented with respect to the substrate to cause the cutout to expose the identification code. The cutout may have a first dimension and a second dimension orthogonal to the first dimension. The first dimension exceeds a corresponding first dimension of the identification code and the second dimension exceeds a corresponding second dimension of the identification code, thereby forming a void region between the identification code and edges of the stiffener structure.

In at least one embodiment, a method of manufacturing an integrated circuit product includes attaching a stiffener structure to a first side of a substrate having an identification code near a perimeter of the substrate. The stiffener structure includes a cutout in an outer perimeter of the stiffener structure. The stiffener structure is oriented with respect to the substrate to cause the cutout to expose the identification code after the attaching. The cutout may have a first dimension and a second dimension orthogonal to the first dimension. The first dimension exceeds a corresponding first dimension of the identification code and the second dimension exceeds a corresponding second dimension of the identification code thereby forming a void region between the identification code and edges of the stiffener structure.

In at least one embodiment, an assembled integrated circuit product includes a substrate including an identification code near a corner of the substrate. The assembled integrated circuit product includes an integrated circuit die attached to the substrate. The assembled integrated circuit system includes discrete devices electrically coupled to the integrated circuit die and surrounding at least a portion of the integrated circuit die. The assembled integrated circuit product includes a stiffener structure attached to the substrate and surrounding the integrated circuit die and the discrete devices. The stiffener structure includes a cutout in an outer corner of the stiffener structure. An orientation of the stiffener structure with respect to the substrate causes the cutout to expose the identification code in the assembled integrated circuit product.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Identification information is typically included on an integrated circuit product as a machine-readable label that includes identification information for the integrated circuit product. The identification information may be stored as an identification code using any encoding mechanism. The identification code can be read by an imaging device (e.g., a camera or other optical device) and processed until it can be interpreted. The information may be extracted from patterns (e.g., horizontal and/or vertical components of an image). The identification code is typically located in an area on a substrate between integrated circuit die and an edge of a stiffener structure, within an aperture or an inner perimeter of the stiffener structure. That area also includes surface mount technology components (e.g., discrete capacitors). For equipment to properly process the identification code, the identification code must be entirely visible with space between the identification code and adjacent discrete components or other adjacent elements disposed on the substrate (e.g., the stiffener structure or encapsulated integrated circuit die).

Figure 1:
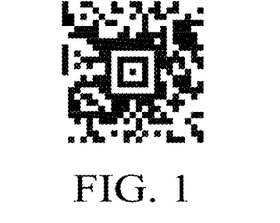
FIG. 1 illustrates an exemplary two-dimensional identification code that may be used to identify an integrated circuit product.
Figure 2:
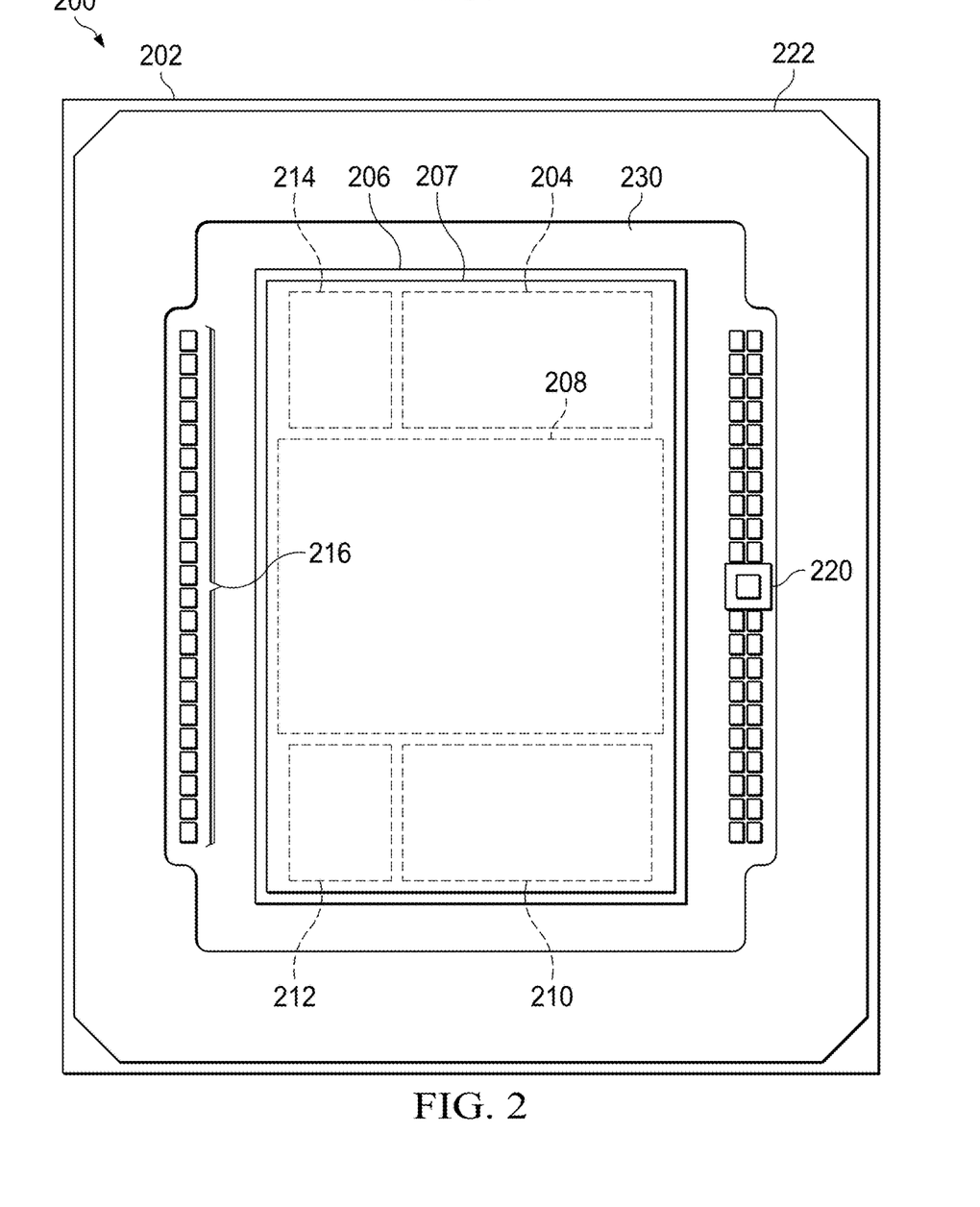
FIG. 2 illustrates a plan view of an exemplary integrated circuit product including an identification code in-line with discrete components within an aperture of a stiffener structure.

Referring to FIG. 1, identification information is represented by an exemplary identification code (e.g., two-dimensional barcode). The identification code is introduced to the substrate by marking, labeling, engraving, etching, laser marking, laser engraving, or laser etching the identification code on the substrate. In other embodiments, the identification code is pre-printed on a label that is affixed to the substrate. Referring to FIG. 2, integrated circuit product 200 includes substrate 202. In at least one embodiment, substrate 202 includes an interposer, organic substrate, or laminate substrate. In at least one embodiment, substrate 202 supports interposer 207 that provides electrical connections and mechanical support for a 2.5D integrated circuit including processor die 208 (e.g., graphics processing integrated circuit die, central processing integrated circuit die, digital signal processing integrated circuit die, or other processing integrated circuit die), memory die 204 and 210 (e.g., high-bandwidth memory integrated circuit die), and dummy silicon die 212 and 214 laid out laterally on substrate 202. Exemplary interposers are formed from silicon or organic materials and provide larger channels for electrical signals than other technologies (e.g., wire bonding). The larger channels reduce power consumption and RC delay of the integrated circuit system.

In at least one embodiment, processor die 208, memory die 204 and 210, and dummy silicon die 212 and 214 are at least partially surrounded by encapsulant, e.g., surrounded on sides but may include exposed top surfaces of processor die 208 and memory die 204 and 210 for heat dissipation purposes. In some embodiments, processor die 208, memory die 204 and 210, and dummy silicon die 212 and 214 are at least partially surrounded by underfill material. In some embodiments, electrical connections between interposer 207 and substrate 202 are at least partially surrounded by underfill 206. Exemplary encapsulants include underfill material, mold compound material, or a combination thereof. In general, an encapsulant fills gaps between integrated circuit die and the substrate to protect interconnect structures and bare die face. The encapsulant mechanically locks dissimilar materials together to reduce or eliminate differential in-plane movement so that interfaces move in harmony with joint integrity preserved. An exemplary encapsulant has a suitable viscosity at an applicable application temperature that is lower than the melting point of any conductive structures present at the time of encapsulation. For example, exemplary mold compound is applied using a compression molding process at a molding temperature of approximately 165° C. for approximately 60-120 minutes. Exemplary materials include Nagase liquid materials for compression molding that are dispensed on a wafer or integrated circuit die and compressed to evenly distribute across the wafer or integrated circuit die. In some embodiments, underfill material is used to alleviate effects of mismatched coefficients of thermal expansion and is positioned between the encapsulant and an upper surface of a redistribution layer. Exemplary underfill materials include epoxy materials or other polymers (e.g., capillary flow underfill material that is dispensed at one or two edges of the integrated circuit die and flows under the integrated circuit die using capillary forces). In some embodiments, molded material is used as an underfill material and as an encapsulant. In at least one embodiment, processor die 208, memory die 204 and 210, and dummy silicon die 212 and 214 are encapsulated by compression molding using a suitable compound followed by grinding to expose top surfaces. In other embodiments, integrated circuit product 200 is formed using a 3D integrated circuit manufacturing technique that stacks integrated circuit die vertically. Note that integrated circuit product 200 is exemplary only and other embodiments include different combinations of processor die, memory die, or dummy silicon die.

Stiffener structure 222 inhibits warpage of substrate 202. Stiffener structure 222 has a shape that tracks the shape of substrate 202. Stiffener structure 202 is a rectangular frame (i.e., ring) having an aperture to accommodate the profile of 2D, 2.5D, and 3D integrated circuit structures and to facilitate heat dissipation. Stiffener structure 222 is made using machine tools for shaping or machining metal or other rigid material by stamping, blanking, pressing, cutting, boring, grinding, shearing, forging, or other deformation technique. In an exemplary embodiment, integrated circuit product 200 includes rows or columns of discrete devices surrounding the encapsulated die. For example, discrete capacitors that provide decoupling capacitance to a power distribution network and have capacitances in the range of micro-Farads are impractical to implement using integrated circuit techniques. Those discrete devices are surface mounted to substrate 202. As referred to herein, a discrete device (or discrete component) is an electronic component with just one circuit element (e.g., resistor, capacitor, inductor, diode). Exemplary discrete capacitors may be ceramic capacitors, film capacitors, etc. In at least one embodiment, integrated circuit product 200 includes rows of capacitor devices 216 that provide decoupling capacitance to a power distribution network using discrete multi-layer ceramic capacitors each having a capacitance in the range from pF to µF.

Integrated circuit product 200 includes identification code 220 in-line with the discrete capacitors with space between identification code 220 and adjacent components and edges of stiffener structure 222 to facilitate detection and decode of the information in the identification code. Typical design rules require void areas (i.e., quite zones or keep-out zones in which devices, routing, and other identifying information are absent) between the discrete components and the identification information, between the identification information and a stiffener structure, or between the identification information and underfill material that surrounds the integrated circuit die. However, in some integrated circuit products, available space between the discrete components and a corresponding stiffener structure and between the discrete components and underfill that surrounds adjacent integrated circuit die is insufficient for proper detection and decode of the identification code. In addition, positioning identification code 220 in-line with discrete components over portions of the substrate that include conductive traces for routing electrical signals reduces the area of substrate that is available to discrete components and integrated circuit die for routing signals.

Figure 3:
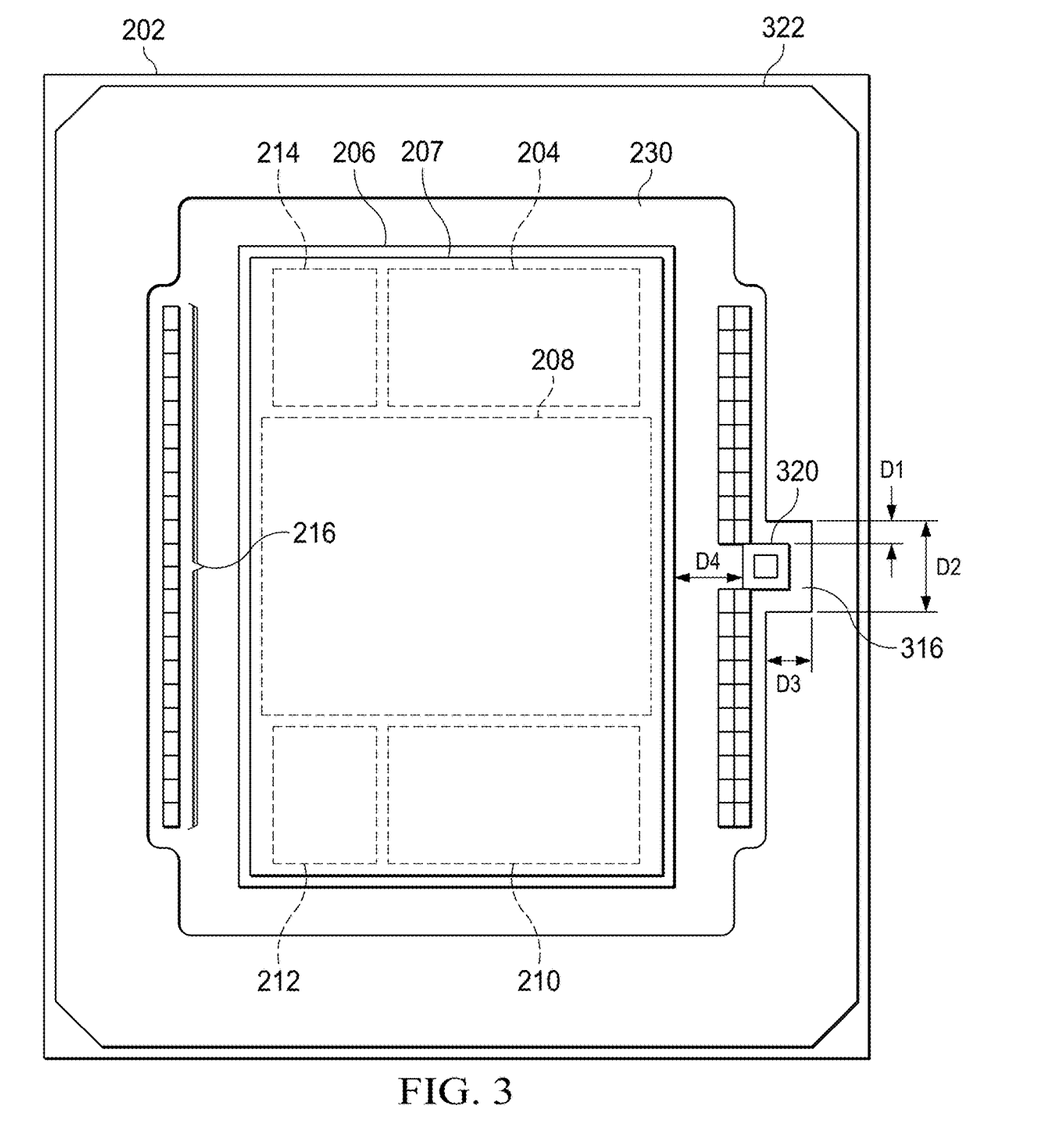
FIG. 3 illustrates a plan view of an exemplary integrated circuit product including an identification code offset from discrete components within an aperture of a stiffener structure including a cutout for viewing the identification code.

Referring to FIG. 3, to reduce the area consumed by the identification code in regions of a substrate that provide electrical routing and to provide additional space between the identification code and other components, an integrated circuit product floorplan positions the identification code in a location that is offset from the discrete components, e.g., between the line of the discrete components and stiffener structure 322. To ensure that identification code 320 is visible during assembly and after assembly, stiffener structure 322 includes cutout 316 in the inner perimeter of stiffener structure 322. Stiffener structure 322 is formed from an opaque material that would otherwise obstruct the view of the identification code 320 and prevent detection and decode of the information. Cutout 316 is a negative space at an edge (e.g., inner perimeter of the aperture) of stiffener structure 322. In at least one embodiment, stiffener structure 322 including the cutout for the identification information is made using machine tools for shaping or machining metal or other rigid material by stamping, blanking, pressing, cutting, boring, grinding, shearing or other deformation technique.

Figure 4:
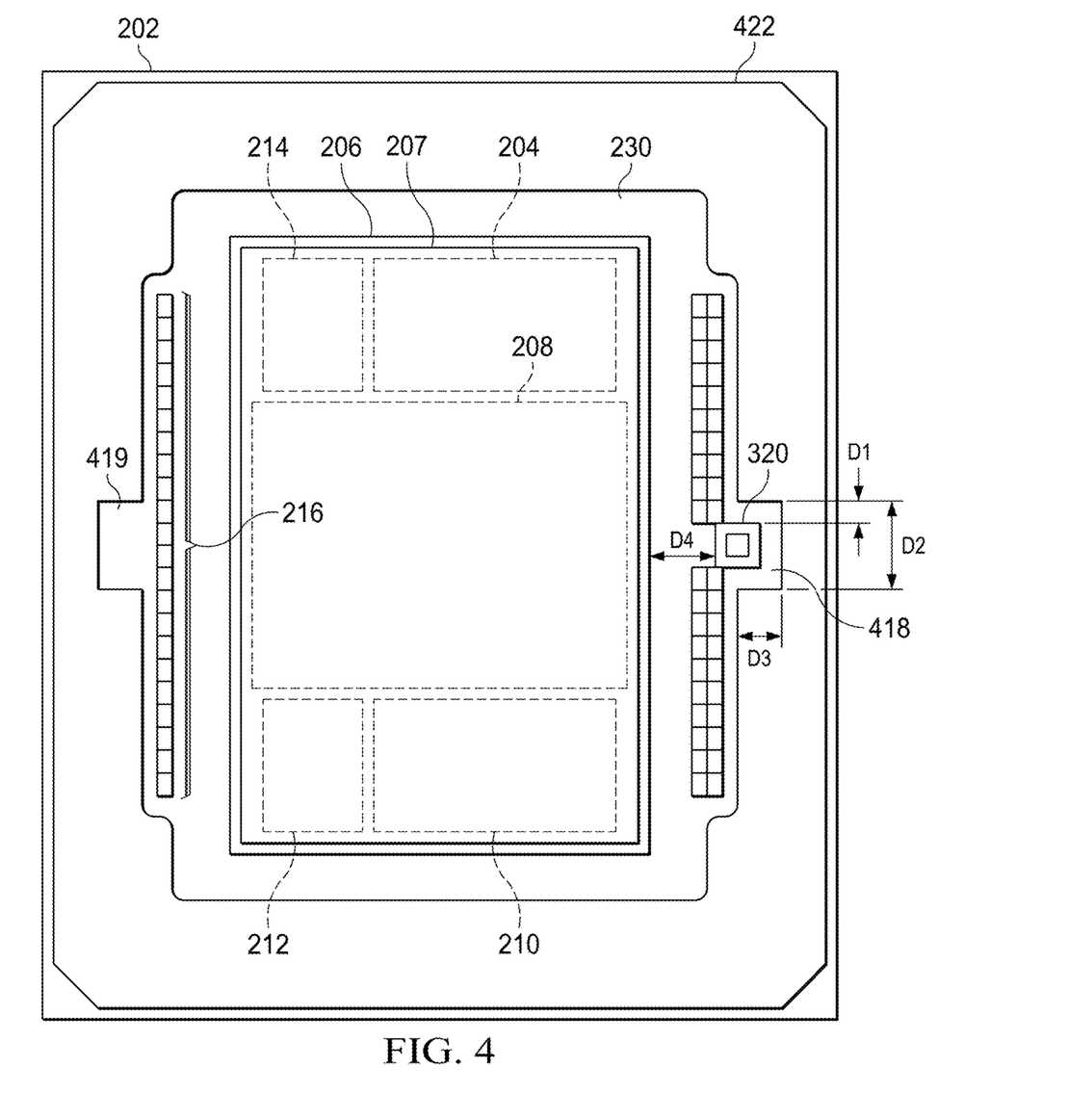
FIG. 4 illustrates a plan view of an exemplary integrated circuit product including an identification code offset from discrete components within an aperture of a stiffener structure including a cutout for viewing the identification code and an opposing cutout.
Figure 5:
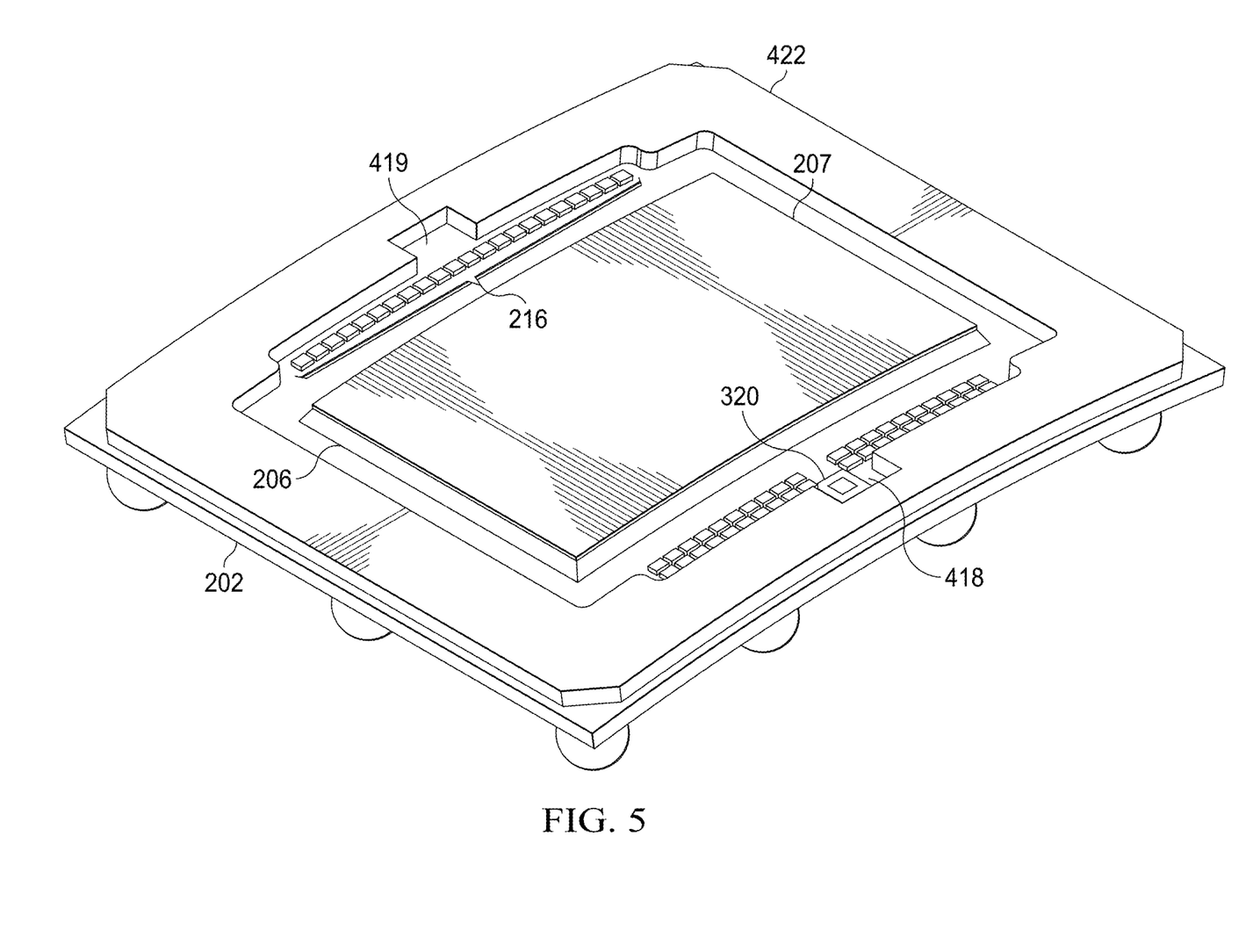
FIG. 5 illustrates a perspective view of an exemplary integrated circuit product including an identification code offset from discrete components within an aperture of a stiffener structure including a cutout for viewing the identification code and an opposing cutout.

When stiffener structure 322 is aligned with the substrate and attached with an orientation that aligns the cutout with the identification code on the substrate, the cutout exposes the identification code and an associated void region that provides sufficient space between the identification code and the inner perimeter of stiffener structure 322 for proper detection and decode. For example, if the identification code occupies 2 mm² and is positioned dimension D4 (e.g., 3 mm) from an edge of underfill material, a void region of dimension D1 (e.g., 1 mm) between the identification code and the inner perimeter of the stiffener structure is implemented by cutout 316 in the stiffener structure that is dimension D2 (e.g., 4 mm) high and dimension D3 (e.g., 2 mm) wide to satisfy design rules that ensure that the identification code is properly decoded even in embodiments where the actual identification code location deviates from a target identification code location. However, inclusion of cutout 316 reduces efficacy of stiffener structure 322. For example, the cutout narrows the width of the stiffener structure and weakens the stiffener structure, causing less reduction in package warpage in the assembled integrated circuit product than a similar stiffener structure without cutout 316. Introduction of an additional cutout in the inner perimeter that makes the stiffener structure symmetrical (e.g., cutout 418 and cutout 418 on opposing sides of the perimeter of stiffener structure 422, as illustrated in FIGS. 4 and 5), which in some embodiments makes warpage easier to control. However, in some embodiments, the additional cutout in the stiffener structure increases the warpage and reduces efficacy of the stiffener structure as compared to a stiffener structure embodiment including only one cutout. Design rules will vary with type of identification code or integrated circuit product package.

Figure 6:
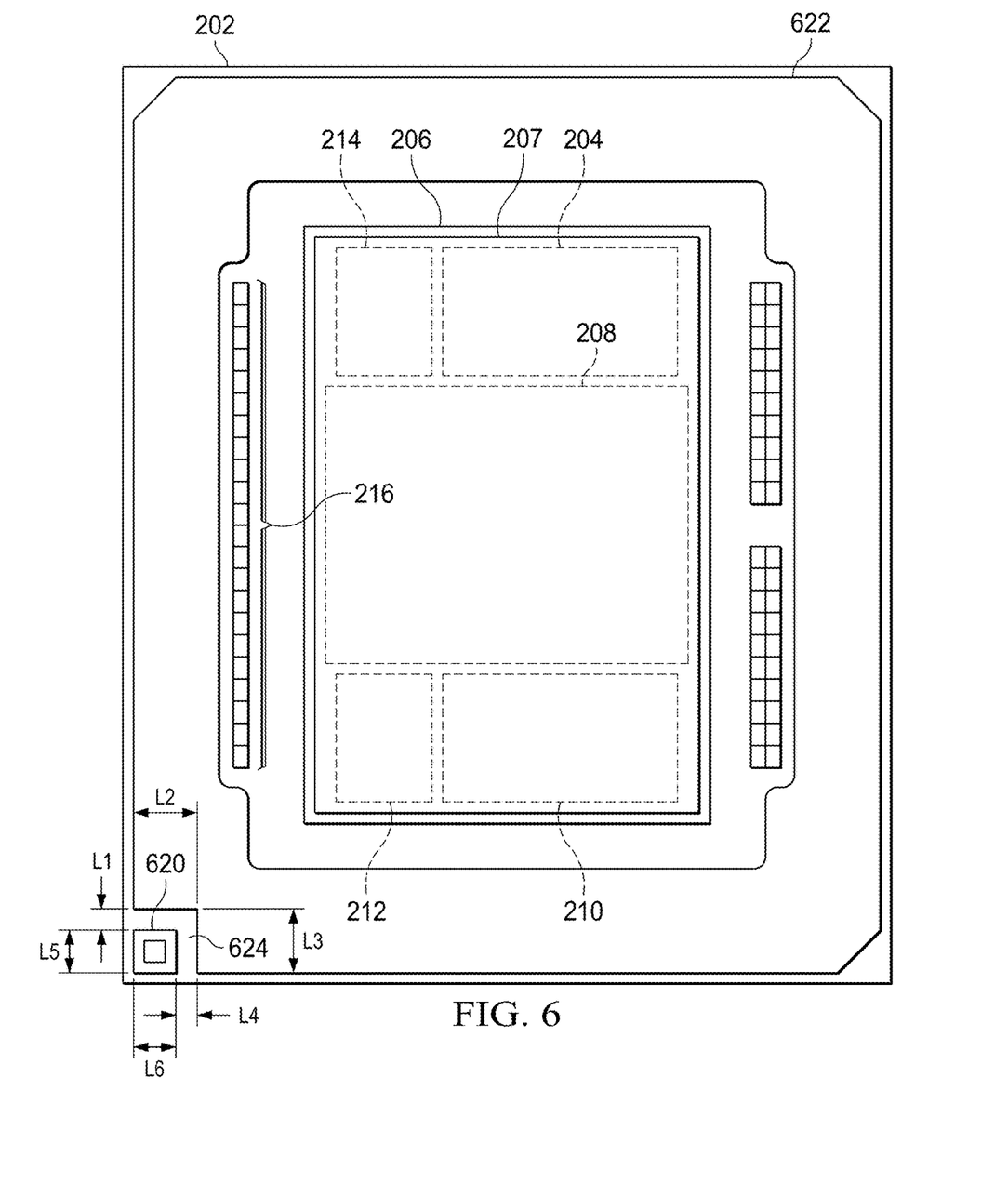
FIG. 6 illustrates a plan view of an exemplary integrated circuit product including an identification code at a corner of a substrate and a stiffener structure including a cutout for viewing the identification code at the corner of the outer perimeter of the stiffener structure consistent with at least one embodiment of the invention.

Rather than include cutouts at an inner perimeter of the stiffener structure, one at least one cutout is implemented on the outer perimeter of a stiffener structure. Typically, substrate edges and corners do not include substrate routing, therefore locating the identification code in the corner of the substrate (e.g., approximately 0.5 mm from edges of the substrate) and forming a corresponding cutout in the stiffener structure increases the amount of substrate area that includes routing available to surface mount devices (e.g., chip capacitors) or other device elements that require substrate routing. FIG. 6 illustrates an exemplary embodiment of an assembled integrated circuit product that includes stiffener structure 622 with cutout 624 at a corner of stiffener structure 622. Cutout 624 has dimension L2 and dimension L3 that is orthogonal to dimension L2, dimension L2 exceeds a corresponding dimension of the identification code, dimension L5, and dimension L3 exceeds a corresponding dimension of the identification code, dimension L6, thereby forming a void region with dimension L1 and dimension L4 between the identification code and edges of stiffener structure 622. Cutout 624 has a length of L2 (e.g., 3 mm²) in the outer perimeter of stiffener structure 622 to accommodate identification code 620 that occupies area L5×L6 (e.g., 2 mm²). In at least one embodiment, cutout 624 is located at an outer corner of stiffener structure 622 and exposes a corner of substrate 202. When stiffener structure 622 is oriented so that cutout 624 is aligned with a corner of the substrate that includes the identification code 620, cutout 624 exposes identification code 620. Cutout 624 provides a void area sufficient for detection and decode of identification code 620 without substantial substrate warpage (e.g., a maximum deviation from coplanarity of 300 µm, which varies with different packages).

Figure 7:
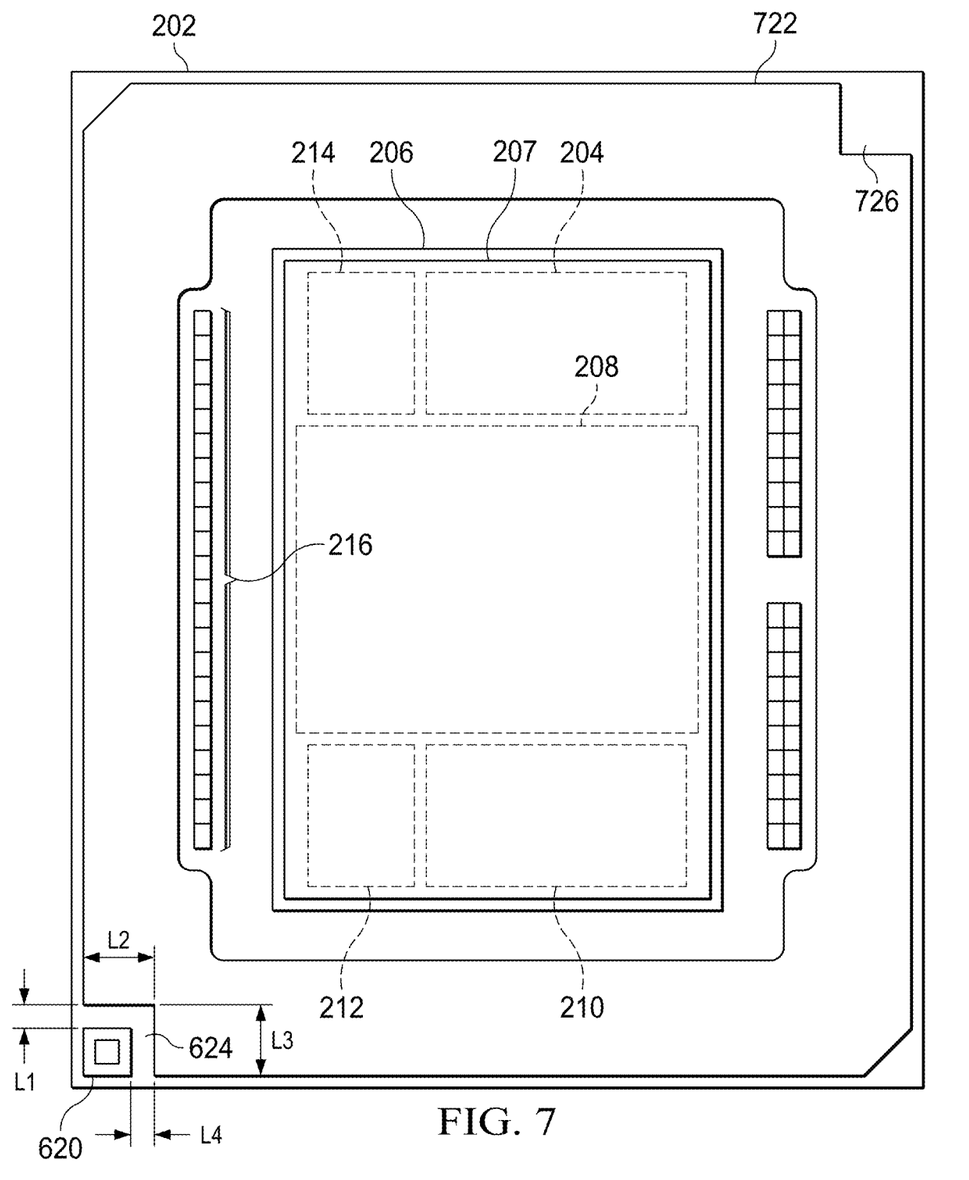
FIG. 7 illustrates a plan view of an exemplary integrated circuit product including an identification code at a corner of a substrate and a stiffener structure including a cutout that exposes the identification code at the corner of the outer perimeter of the stiffener structure and an additional cutout at an opposing corner consistent with at least one embodiment of the invention.
Figure 8:
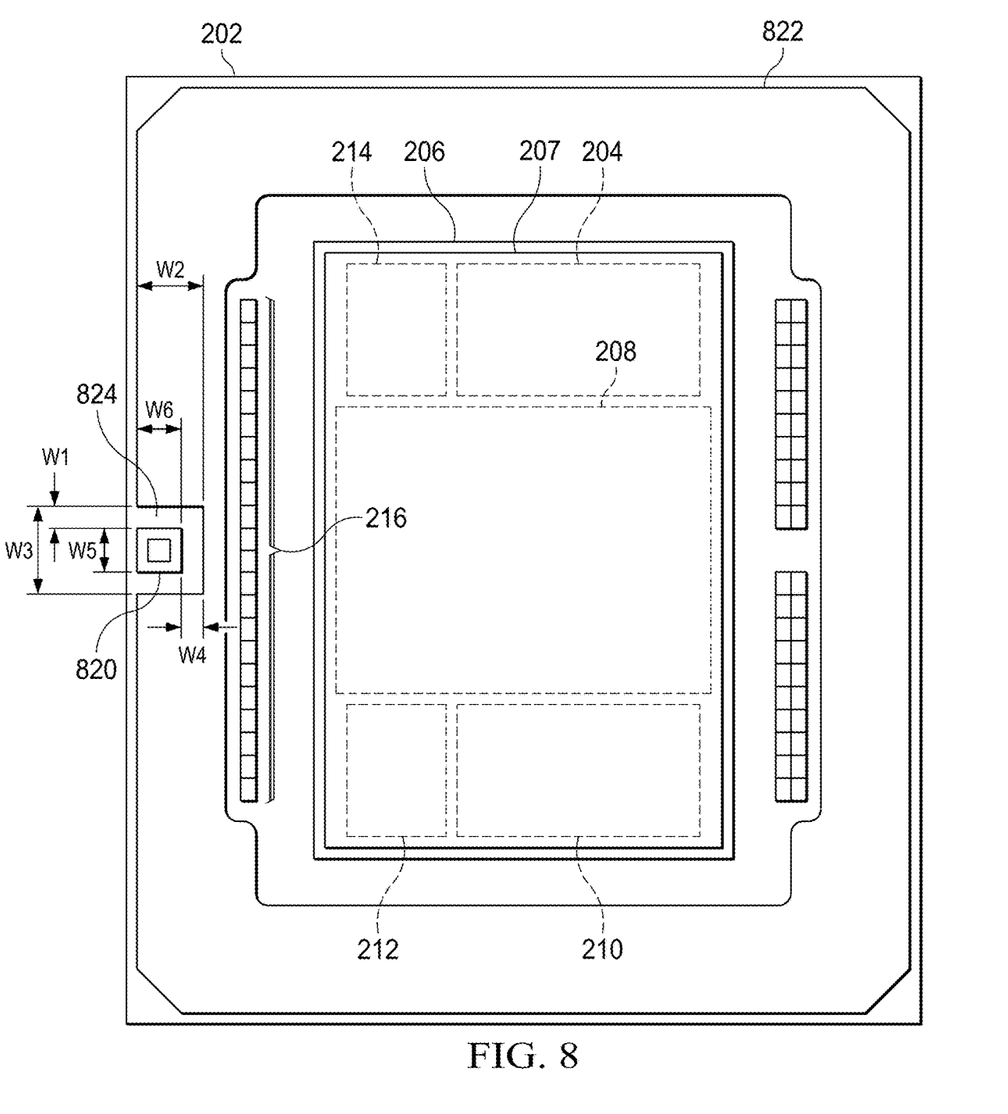
FIG. 8 illustrates a plan view of an exemplary integrated circuit product including an identification code near the perimeter of a substrate and a stiffener structure including a cutout that exposes the identification code at the outer perimeter of the stiffener structure consistent with at least one embodiment of the invention.

In other embodiments, the stiffener structure includes a duplicate cutout in the corner opposite to cutout 624, as illustrated in FIG. 7. This embodiment does not substantially increase substrate warpage from the integrated circuit product of FIG. 6. FIG. 8 illustrates another embodiment of an integrated circuit product with customizations for identification code visibility including cutout 824 that is located along outer perimeter of stiffener structure 822 along a length of substrate 822. Cutout 824 has dimension W2 and dimension W3 that is orthogonal to dimension W2. Dimension W2 exceeds a corresponding dimension of the identification code, dimension W5, and dimension W3 exceeds a corresponding dimension of the identification code, dimension W6, thereby forming a void region with widths W1 and W4 between identification code 820 and edges of stiffener structure 822. Although stiffener structures 622, 722, and 822 are described herein as a rectangular frame or ring having an aperture in the center, in other embodiments, the stiffener structure has a different shape (e.g., square, cross-shaped, hexagonal, decagonal, or other shape) that tracks the shape of the substrate and includes a cutout at the outer perimeter of the stiffener structure that when aligned with the identification code on the substrate exposes the identification code and provides a void area sufficient for detection and decode of the identification code.

Techniques described herein are consistent with any assembly sequence and a stiffener structure customized for identification code visibility can be assembled first, last, or in between assembly of other components with dimensions adequate to expose the identification code for detection and decode of identification information. In at least one embodiment, an integrated circuit product assembly process includes attaching a stiffener structure is attached to the substrate prior to attaching any of the integrated circuit die, since attaching and encapsulating integrated circuit die may warp the substrate and cause solder opens or shorts. In other embodiments of the integrated circuit product assembly process, the stiffener structure is attached after some of the integrated circuit die are attached to the substrate and underfilled, but prior to attachment of other elements of the integrated circuit product (e.g., surface mounted components). In other embodiments of the integrated circuit product assembly process, the stiffener structure customized for identification code visibility is attached after all other components are assembled. Regardless of when during the assembly process a stiffener structure stiffener structure customized for identification code visibility is attached to the substrate, the identification code is exposed for detection and decode at any time during or after assembly of the integrated circuit product.

Figure 9:
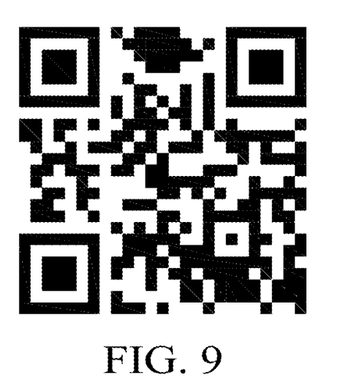
FIGS. 9-11 illustrate various exemplary two-dimensional identification codes that may be used to identify an integrated circuit product.
Figure 10:
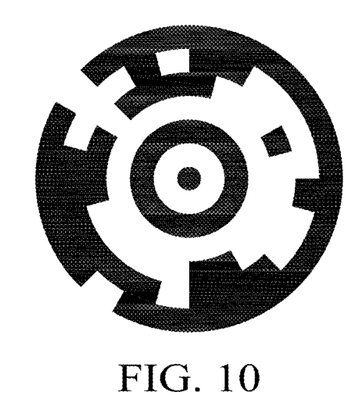
Figure 11:
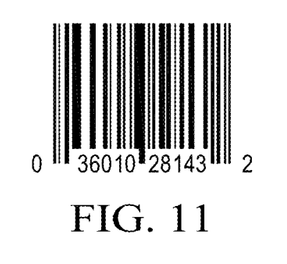

Note that although the invention is described where the information is included on the substrate using a two-dimensional code, other types of identification codes may be used. For example, the two-dimensional code may be an Aztec-Code (FIG. 1), a Quick Response (QR) Code (FIG. 9), or ShotCode (FIG. 10) and a stiffener structure customized for identification code visibility includes a square or rectangular cutout in a that has dimensions that provide a void region sufficient to detect and decode those codes. In other embodiments, a stiffener structure customized for identification code visibility includes rectangular cutouts that accommodate one-dimensional codes, e.g., UPC-A barcode (FIG. 11).

Thus, techniques for including identification information on a substrate of an integrated circuit product have been described. By locating the identification information at the perimeter of the substrate (e.g., at a corner of the substrate) and forming a corresponding cutout in outer perimeter of the stiffener structure, warpage control provided by the stiffener structure is not compromised by including the cutout for the identification information and is improved as compared to a stiffener structure design with the cutout in the inner perimeter of the stiffener structure.

While the invention has been described in an embodiment in which a 2.5D, one-sided packaging technique is used, one of skill in the art will appreciate that the teachings herein can be utilized with single die embodiments or other integrated circuit packaging techniques that use a stiffener structure (e.g., flip chip packaging techniques, 3D packaging techniques, double-sided packaging techniques). The description of the invention set forth herein is illustrative and is not intended to limit the scope of the invention as set forth in the following claims. Variations and modifications of the embodiments disclosed herein may be made based on the description set forth herein, without departing from the scope of the invention as set forth in the following claims.

What is claimed is:

1. An integrated circuit product comprising:
   a substrate including an identification code on a first side of the substrate and near a perimeter of the substrate; and
   a stiffener structure attached to the first side of the substrate, the stiffener structure having a cutout in an outer perimeter of the stiffener structure, the stiffener structure being oriented with respect to the substrate to cause the cutout to expose the identification code.

2. The integrated circuit product as recited in claim 1 wherein the cutout has a first dimension and a second dimension orthogonal to the first dimension, the first dimension exceeding a corresponding first dimension of the identification code and the second dimension exceeding a corresponding second dimension of the identification code, thereby forming a void region between the identification code and edges of the stiffener structure.

3. The integrated circuit product as recited in claim 1 wherein the identification code is located at a corner of the substrate and the cutout is formed at an outer corner of the stiffener structure.

4. The integrated circuit product as recited in claim 1 wherein the identification code is a two-dimensional barcode.

5. The integrated circuit product as recited in claim 1 further comprising:
   a discrete component attached to the first side of the substrate around an integrated circuit die disposed within an aperture of the stiffener structure on a region of the substrate including conductive routing and the identification code disposed on a region of the substrate without conductive routing.

6. The integrated circuit product as recited in claim 1,
   wherein the identification code is a rectangular code having a first length and a first width, and
   wherein the cutout has a rectangular shape having a second length and a second width, the second length being at least as long as the first length and the second width being at least as wide as the first width.

7. The integrated circuit product as recited in claim 1,
   wherein the identification code is square having a first length, and
   wherein the cutout is rectangular and has a minimum dimension at least as long as the first length.

8. The integrated circuit product as recited in claim 1 wherein an assembly of the substrate and the stiffener structure is substantially flat.

9. A method of manufacturing an integrated circuit product, the method comprising:
   attaching a stiffener structure to a first side of a substrate having an identification code near a perimeter of the substrate,
   wherein the stiffener structure includes a cutout in an outer perimeter of the stiffener structure, the stiffener structure being oriented with respect to the substrate to cause the cutout to expose the identification code after the attaching.

10. The method as recited in claim 9 wherein the cutout has a first dimension and a second dimension orthogonal to the first dimension, the first dimension exceeding a corresponding first dimension of the identification code and the second dimension exceeding a corresponding second dimension of the identification code thereby forming a void region between the identification code and edges of the stiffener structure.

11. The method as recited in claim 9 further comprising:
forming the stiffener structure having a rectangular shape and an aperture,
wherein the cutout is rectangular.

12. The method as recited in claim 9 wherein the identification code is located at a corner of the substrate and the cutout is formed at an outer corner of the stiffener structure.

13. The method as recited in claim 9 further comprising:
attaching an integrated circuit to the first side of the substrate within an aperture of the stiffener structure; and
attaching a discrete component to the first side of the substrate between the integrated circuit and the stiffener structure.

14. The method as recited in claim 13 wherein the stiffener structure is attached to the first side of the substrate before attaching the integrated circuit to the first side of the substrate.

15. The method as recited in claim 9 wherein an assembly of the substrate and the stiffener structure is substantially flat.

16. The method as recited in claim 9 further comprising:
forming the identification code on the substrate.

17. The method as recited in claim 9 wherein the attaching comprises aligning the stiffener structure with the substrate to expose the identification code by the cutout.

18. The method as recited in claim 9
wherein the identification code is a rectangular code having a first length and a first width, and
wherein the cutout has a rectangular shape having a second length and a second width, the second length being at least as long as the first length and the second width being at least as wide as the first width.

19. The integrated circuit product formed by the method as recited in claim 9.

20. An assembled integrated circuit product comprising:
a substrate including an identification code near a corner of the substrate;
an integrated circuit die attached to the substrate;
discrete devices electrically coupled to the integrated circuit die and surrounding at least a portion of the integrated circuit die; and
a stiffener structure attached to the substrate and surrounding the integrated circuit die and the discrete devices,
wherein the stiffener structure includes a cutout in an outer corner of the stiffener structure and an orientation of the stiffener structure with respect to the substrate causes the cutout to expose the identification code in the assembled integrated circuit product.

21. The integrated circuit product as recited in claim 1 wherein the integrated circuit product has a maximum deviation from coplanarity of 300 µm.

* * * * *

UNITED STATES PATENT AND TRADEMARK OFFICE
CERTIFICATE OF CORRECTION

PATENT NO.       : 11,315,883 B2
APPLICATION NO.  : 16/680978
DATED            : April 26, 2022
INVENTOR(S)      : Suming Hu et al.

It is certified that error appears in the above-identified patent and that said Letters Patent is hereby corrected as shown below:

In the Specification

In Column 7, Line 20, please delete "is attached".

Signed and Sealed this
Fifth Day of July, 2022

Katherine Kelly Vidal
*Director of the United States Patent and Trademark Office*